United States Patent [19]

Sempel

[11] Patent Number: 4,871,985

[45] Date of Patent: Oct. 3, 1989

[54] LOW NOISE RELAXATION OSCILLATOR

[75] Inventor: Adrianus Sempel, Eindhoven, Netherlands

[73] Assignee: U.S. Philips Corporation, New York, N.Y.

[21] Appl. No.: 208,187

[22] Filed: Jun. 16, 1988

[30] Foreign Application Priority Data

Jun. 23, 1987 [NL] Netherlands .......................... 8701462

[51] Int. Cl.[4] .............................................. H03K 3/00
[52] U.S. Cl. .................................... 331/111; 331/143; 331/177 R
[58] Field of Search .............. 331/34, 111, 143, 177 R

[56] References Cited

U.S. PATENT DOCUMENTS 4,742,315  5/1988  Schreilechner ................. 331/111 X

OTHER PUBLICATIONS

IEEE Journal of Solid State Circuits, vol. SC-18, No. 6, Dec. 1983, pp. 794–801.

Primary Examiner—Eugene R. LaRoche
Assistant Examiner—Robert J. Pascal
Attorney, Agent, or Firm—Bernard Franzblau

[57] ABSTRACT

A relaxation oscillator in which a capacitor is periodically charged and discharged. The relaxtion oscillator includes two transistors connected parallel to the capacitor with their base-emitter paths in anti-parallel. When a voltage equal to the base-emitter voltage of one of the transistors is reached, this transistor is turned on so that:
(a) the capacitor is not charged further, and
(b) switching over takes place from charging to discharging (i.e. charging in the opposite sense). Thus, the effect of noise on the instant of switching over is substantially reduced.

11 Claims, 1 Drawing Sheet

LOW NOISE RELAXATION OSCILLATOR

BACKGROUND OF THE INVENTION

This invention relates to a relaxation oscillator comprising a capacitor, a charging circuit, a discharging circuit, switching means having a first position for charging the capacitor by means of the charging circuit and having a second position for discharging the capacitor by means of the discharging circuit, and a feedback circuit which supplies a first feedback signal for setting the switching means from the first position to the second position after the capacitor voltage has reached a first value and which supplies a second feedback signal for setting the switching means from the second position to the first position after the capacitor voltage has reached a second value.

A relaxation oscillator of this kind is known from the IEEE Journal of Solid State Circuits, Vol. SC-18, No. 6, Dec. 1983, pages 794–801. The feedback circuit thereof is formed by a flipflop circuit. As soon as the capacitor voltage exceeds one of the trigger points of the flipflop circuit, the flipflop switches over and the switching means are set to the first or the second position. A relaxation oscillator of this kind delivers a delta voltage whose peak-to-peak value is determined, inter alia, by said first and second voltage values, the hysteresis of the flipflop circuit, and the loop gain present at the instant of switching. The cited article discloses, explicitly or otherwise, a number of possibilities for improving the noise behavior of the relaxation oscillators, i.e. increasing the capacitor delta voltage, increasing the loop gain at the instant of switching, reducing the effect of the hysteresis of the flipflop circuit, and the fast switching over of the current by means of a fast flipflop circuit.

The problem of noise in relaxation oscillators can usually be avoided by using other oscillator types displaying low-noise behavior. However, considering the advantages offered by a relaxation oscillator, such as a wide frequency tuning range and the possibility of integration in an IC, further improvement of the noise behavior of the relaxation oscillators is desirable.

SUMMARY OF THE INVENTION

Therefore, it is an object of the invention to provide a relaxation oscillator which exhibits a further improved noise behavior.

To achieve this, the relaxation oscillator of the kind set forth in accordance with the invention is characterized in that the feedback circuit comprises a first and a second transistor which are connected in a mutually opposite orientation across the capacitor as to their respective paths between gate electrode and first main electrode. The first and the second feedback signal, respectively, are derived from a voltage value on a second main electrode of the first transistor and the second transistor, respectively. In the embodiment of a relaxation oscillator which is shown in FIG. 17 of the cited article, the feedback circuit comprises two independently operating transistor pairs in a differential amplifier configuration. Because the present invention utilizes only two independently operating switching elements, i.e. only two independently operating bipolar transistors or mosfets, the noise behavior of the relaxation oscillator in accordance with the invention will be much better. If desired, diodes can be connected in the base lead and/or the emitter lead or in the source lead. The transistors will now have a dual function: on the one hand they operate as a comparator for the capacitor voltage in order to derive the feedback signals for the switching means, and on the other hand they form an accurately defined limitation for the capacitor voltage.

The feedback circuit in accordance with the invention may also comprise a low-pass filter which is connected to both switching elements. This low-pass filter also improves the noise behavior of the relaxation oscillator. However, it introduces a delay in the switching over of the switching means. Because the switching elements constitute a limitation for the capacitor, however, despite the delay, the capacitor voltage will be maintained at a constant value during this delay.

In accordance with the invention, the relaxation oscillator can also be included in an integrated circuit.

BRIEF DESCRIPTION OF THE DRAWING

The invention will be described in detail hereinafter with reference to the accompanying drawings; wherein.

DESCRIPTION OF THE PREFERRED EMBODIMENT

Figure 1:
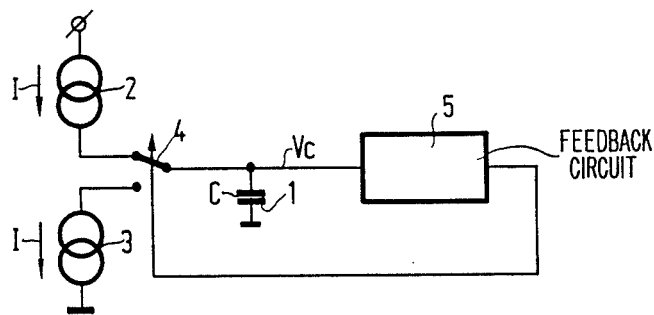
FIG. 1 shows the circuit diagram of the known type of relaxation oscillator.

Corresponding parts in the Figures are denoted by corresponding reference numerals. The embodiment described with reference to the drawings is given merely by way of example and the invention is by no means restricted thereto.

The relaxation oscillator which is diagrammatically shown in FIG. 1 comprises a capacitor 1, a charge circuit 2, a discharge circuit 3, a switch 4, and a feedback circuit 5. The charging circuit 2 and the discharging circuit in FIG. 1 are shown as current sources which draw a current I. When the switch 4 occupies the first position (as shown in FIG. 1), the capacitor 1 is charged by the current source 2. When the switch 4 is set to the second position, the current source 3 draws a discharging current I from the capacitor 1. The capacitance C of the capacitor 1 is such that a substantially linear voltage variation occurs across the capacitor during charging and discharing, so that ultimately a substantially delta-shaped voltage variation will occur across the capacitor.

The capacitor voltage Vc is applied to the feedback circuit 5. Therein it is compared with a first, higher voltage value Vref. 1 and with a second, lower voltage value Vref. 2. When the capacitor voltage reaches the value Vref. 1, the feedback circuit 5 supplies a first feedback signal which sets the switch 4 from the first to the second position so that the capacitor 1 is discharged and the capacitor voltage Vc decreases. As soon as the capacitor voltage Vc subsequently reaches the value Vref. 2, the feedback circuit 5 supplies a second feedback signal which sets the switch 4 from the second to the first position so that the capacitor 1 is charged again and hence the capacitor voltage Vc increases again.

Figure 2:
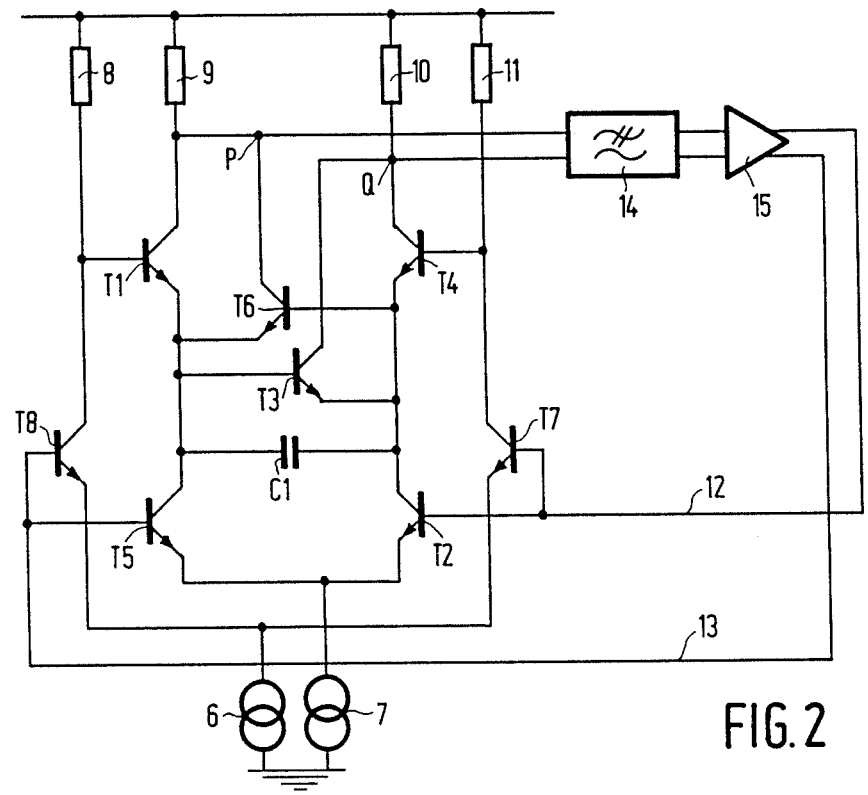
FIG. 2 shows an embodiment of a relaxation oscillator in accordance with the invention.

In the embodiment in accordance with the invention which is shown in FIG. 2, the current sources 2 and 3, together with the switch 4, are formed by a C1, similar in function to capacitor 1 of FIG. 1. This bridge circuit is composed of the transistors T1, T2, T4, T5, T7 and T8, the current sources 6 and 7 and the resistors 8, 9, 10 and 11. The capacitor C1 is charged, for example, when the transistors T1, T2 are turned on and the transistors T4, T5 are turned off. The capacitor C1 is discharged, i.e. charged with the opposite polarity, when the transistors T1, T2 are turned off and the transistors T4, T5 are turned on. The charging current flows via the resistor 9, the transistor T1, the capacitor C1, the transistor T2 and the current source 7. The voltage on the lead 12 should then be so "high" that the transistors T2 and T7 are turned on so that a voltage drop occurs across the resistor 11 such that the base voltage of the transistor T4 is "low" and, consequently, this transistor is turned off. Furthermore, the voltage on the lead 13 should then be so "low" that the transistors T5 and T8 are turned off, so that the base voltage of the transistor T1 is "high" and, consequently, this transistor is turned on.

During the discharge of the capacitor C1, the current flows via the resistor 10, the transistor T4, the capacitor C1, the transistor T5 and the current source 7. The voltage on the lead 12 should be so "low" that the transistors T2 and T7 are turned off, so that the base voltage of the transistor T4 is "high" and, consequently, this transistor is turned on. Furthermore, the voltage on the lead 13 should then be so "high" that the transistors T5 and T8 are turned on, so that such a voltage drop occurs across the resistor 8 that the base voltage of the transistor T1 is "low" and, consequently, this transistor remains turned off. Therefore, during charging the voltage on the lead 12 should be "high" and that on the lead 13 should be "low", whereas during discharging, i.e. during charging with the opposite polarity, the voltage on the lead 12 should be "low" and that on the lead 13 should be "high".

Across the capacitor C1 there are arranged two switching elements which are in this case formed by the transistors T3 and T6. These transistors are connected across the capacitor C1 with the base and the emitter in antiparallel. During the charging of the capacitor C1, the voltage across the capacitor increases until the base-emitter voltage Vbe(T3) of the transistor T3 is reached and this transistor is turned on. Similarly, during discharging, i.e. during charging with the opposite polarity, the voltage across the capacitor C1 decreases until it has increased in the negative sense to such an extent that the base-emitter voltage Vbe(T6) of the transistor T6 is reached and this transistor is turned on. Consequently, the capacitor voltage varies between two values Vref.1 and Vref.2, where:

Vref.1−Vref.2=Vbe(T3)+Vbe(T6).

Diodes may be connected between the base of the transistors T3 and T6 and the relevant connection to the capacitor C1. Similarly, diodes may also be connected between the emitters of the transistors T3 and T6 and the relevant other connections to the capacitor C1.

Figure 3:
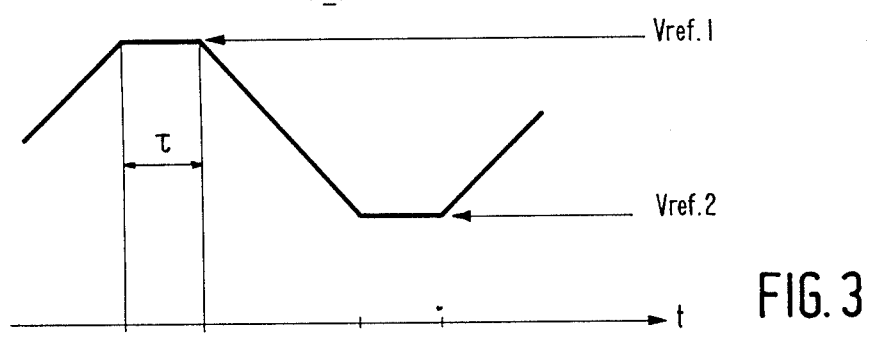
FIG. 3 shows a diagram illustrating the operation of the embodiment shown in FIG. 2.

The transistor T4 is turned off during charging; when the capacitor voltage reaches its upper limit and the transistor T3 is turned on, an increasing current flows via the resistor 10 and the transistor T3, which current is withdrawn from the charging current through the resistor 9 and the transistor T1 since the total current drawn by the current source 7 via the transistor T2 remains constant. Consequently, the voltage at the point P increases and that at the point Q decreases. Due to this variation of the voltage values VP and VQ, the voltage values on the leads 12 and 13 are "reversed", i.e. they become "low" and "high", respectively, via a feedback circuit which includes a low-pass filter 14 and a control amplifier 15 in the present embodiment. Consequently, the capacitor C1 is discharged until the capacitor voltage reaches its lower limit and the transistor T6 is turned on. The transistor T3 is turned off again during dfischarging. As soon as the transistor T6 is turned on, an increasing current will flow via the resistor 9 and the transistor T6, which current is withdrawn from the discharging current through the resistor 10 and the transistor T4 since the total current drawn by the current source 7 via the transistor T5 remains constant. Consequently, the voltage at the point P decreases and that at the point Q increases. This variation of the voltage values VP and VQ causes a "reversal" of the voltage values on the leads 12 and 13 to their former values again via said feedback circuit, so that the capacitor voltage can increase again. Thus, the transistors T3 and T6 on the one hand determine the instant at which the increase and the decrease, respectively, of the capacitor voltage must be interrupted, and on the other hand they ensure that the capacitor voltage is maintained at a constant value for as long as the capacitor voltage variation in the opposite direction has not yet started. The difference in time between the turning on of the transistors T3 and T6 and the start of the reversed voltage variation across the capacitor is caused by the delay in the feedback circuit which is due notably to the low-pass filter 14. Even though this filter is extremely desirable for improving the noise behavior of the relaxation oscillator, it does introduce a delay. The capacitor voltage is maintained constant during this delay. FIG. 3 shows the voltage variation across the capacitor 1, which variation takes place, each time after a delay $\tau$, between the two values Vref.1 and Vref.2.

It will be apparent that the terms "charging" and "discharging" as used herein can be simply interchanged and that the circuit shown in FIG. 2 can be modified in various ways without departing from the scope of the present invention. For example, as has already been stated diodes can be included in the base leads and emitter leads of the transistors T3 and T6.

What is claimed is:

1. A relaxation oscillator comprising: a capacitor, a charging circuit, a discharging circuit, switching means having a first position for charging the capacitor by means of the charging circuit and having a second position for discharging the capacitor by means of the discharging circuit, and a feedback circuit which supplies a first feedback signal for setting the switching means from the first position to the second position after the capacitor voltage has reached a first value and which supplies a second feedback signal for setting the switching means from the second position to the first position after the capacitor voltage has reached a second value, wherein the feedback circuit comprises a first and a second transistor each having a control electrode and first and second main electrodes, said first and second transistors having their respective paths between control electrode and first main electrode connected in a mutually opposite orientation across the capacitor, the first and the second feedback signals, respectively, being derived from a voltage value on a second main electrode of the first transistor and the second transistor, respectively.

2. A relaxation oscillator as claimed on claim 1, further comprising a diode connected in series with at least one of said paths across the capacitor.

3. A relaxation oscillator as claimed in claim 2, wherein the transistors are of a bipolar type, said paths being base-emitter paths and the second main electrodes being collectors.

4. A relaxation oscillator as claimed in claim 1 wherein the feedback circuit comprises a low-pass filter which is connected to both transistors.

5. A relaxation oscillator as claimed in claim 1, wherein the transistors are of a bipolar type, said paths being base-emitter paths and the second main electrodes being collectors.

6. A relaxation oscillator as claimed in claim 2, wherein the feedback circuit comprises a low-pass filter which is connected to both transistors.

7. A relaxation oscillator as claimed in claim 1, including a body of semiconductor material in which said relaxation oscillator is formed as an integrated circuit.

8. A relaxation oscillator as claimed in claim, wherein said switching means comprise third, fourth, fifth and sixth transistors connected as a bridge circuit across a pair of voltage supply lines and with the capacitor connected across output terminals of the bridge circuit.

9. A relaxation oscillator as claimed in claim 8, further comprising a source of constant current connected in series circuit with said bridge circuit across said pair of voltage supply lines.

10. A relaxation oscillator as claimed in claim 9, further comprising seventh and eighth transistors connected in parallel and a second constant current source connected in series with said seventh and eighth parallel connected transistors across said pair of voltage supply lines, means connecting an output electrode of the seventh transistor to a control electrode of one transistor in a first branch of the bridge circuit and an output electrode of the eighth transistor to a control electrode of one transistor in a second branch of the bridge circuit, and means coupling said first and second feedback signals from said feedback circuit to respective control electrodes of the seventh and eighth transistors.

11. A relaxation oscillator as claimed in claim 9, wherein said feedback circuit includes a low-pass filter.

* * * * *